United States Patent
Luo

(10) Patent No.: US 6,169,700 B1
(45) Date of Patent: Jan. 2, 2001

(54) WAIT STATE GENERATOR CIRCUIT AND METHOD TO ALLOW ASYNCHRONOUS, SIMULTANEOUS ACCESS BY TWO PROCESSORS

(75) Inventor: Wenzhe Luo, Allentown, PA (US)

(73) Assignee: Lucent Technologies, Inc., Murray Hill, NJ (US)

(*) Notice: Under 35 U.S.C. 154(b), the term of this patent shall be extended for 0 days.

(21) Appl. No.: 09/244,040

(22) Filed: Feb. 4, 1999

(51) Int. Cl.[7] ........................................... G11C 8/00
(52) U.S. Cl. ............... 365/230.05; 365/233; 365/189.04; 365/230.06
(58) Field of Search ............... 365/230.05, 233, 365/230.06, 189.04, 194

(56) References Cited

U.S. PATENT DOCUMENTS 5,434,989 * 7/1995 Yamaguchi .......................... 395/400
5,502,683 * 3/1996 Marchioro ....................... 365/230.05
5,768,211 * 6/1998 Jones et al. ..................... 365/230.05

\* cited by examiner

*Primary Examiner*—Huan Hoang
(74) *Attorney, Agent, or Firm*—William H. Bollman

(57) ABSTRACT

An asynchronous wait state generator circuit and method is included in a dual port device, e.g., in a dual port memory, to allow the use of separate address decoders and simultaneous access to memory locations from asynchronously operating, separate ports. When an address collision is detected between accesses on both ports of a dual port device, a wait state signal is generated for the relevant port having the later attempt to access the same memory or other addressable location. In the unique event wherein both accesses are initiated at precisely the same time, a metastable element is used to resolve the condition and to allow access to a prioritized port. The wait state signals output for the relevant port of the dual port device are preferably synchronized with the clock signal of the relevant port.

38 Claims, 8 Drawing Sheets

WAIT SIGNAL GENERATION CIRCUIT
123

META-STABLE CAPABLE DFF TYPE SYNCHRONIZER

WAIT STATE GENERATOR CIRCUIT AND METHOD TO ALLOW ASYNCHRONOUS, SIMULTANEOUS ACCESS BY TWO PROCESSORS

BACKGROUND OF THE INVENTION

1. Field of the Invention

The present invention relates to dual port access to elements of a common device. More particularly, it relates to a wait state generator which allows simultaneous access to all elements of the common device, e.g., dual port memory.

2. Background of Related Art

Digital memory is found in nearly every digital electronic device, particularly when such device includes a processor (e.g., a microprocessor, microcontroller, or digital signal processor). Many types of digital memory exist, perhaps the most common form being random access memory (RAM).

With advancements in technology came the need to include more than one processor in a device. While each processor (or other) device has its own assigned tasks, information is typically made available to either processor through the use of a commonly accessible memory, e.g., RAM. This commonly accessible memory is typically called a "dual port memory" because it usually has an individual address and data bus (i.e., port) for each accessing processor.

Dual port memories are used in digital circuitry to allow two address/data buses access to common memory. For instance, a microprocessor and a digital signal processor may cooperatively pass data back and forth through the common memory. In such a case, the first processor or other device would access particular address/data locations using a first port of the dual port memory, and the second processor or other device would access particular address/data locations using a second port of the dual port memory.

FIG. 5 shows a conventional dual port, common memory 504 having a first port 579 including an address and data bus connected to a first processor 500, and a second port 589 including another address and data bus connected to a second processor 502.

As shown in FIG. 6, from an external perspective, it appears as if either processor 500, 502 can access any memory location 530–545 at any time. For instance, in the example shown in FIG. 6, the first processor 500 is addressing memory location 535, and the memory location 535 is allowing an appropriate write operation (or other operation) on the first data bus DATA 1 corresponding to the first processor 500. At the same time, the second processor 502 is accessing memory location 542 using its corresponding address and data buses ADDR 2, DATA 2. The example of simultaneous access to memory locations 535 and 542 by the respective processors 500, 502 using conventional dual port memory 504 operates correctly.

However, as shown in the example of FIG. 7, a collision would occur in the event that both processors 500, 502 try to access the same memory location (or memory block commonly enabled) 542. In this case, an unpredictable state would occur with respect to data output on the respective data buses DATA 1, DATA 2.

FIG. 8 shows a common solution to the problem of potential collisions in accesses to memory locations in conventional dual port memory.

In particular, in FIG. 8, a multiplexing scheme is implemented, e.g., using multiplexers 800, 802, together with an arbiter 840. The arbiter allows singular access to the common memory 504 at any one time by alternately controlling a multiplexer relating to the address ports ADDR 1, ADDR 2, and a multiplexer relating to the data ports DATA 1, DATA 2. Only one address is applied to an address decoder 820 in the common memory 504 at any one time, thus enabling only one memory location 530–545 at any one time to output on either data bus DATA 1, DATA 2.

Multiplexed access to common memory locations from two ports prevents the potential for collisions between accesses by two processors or other devices utilizing the two ports of a dual port memory. However, because of the serial access to the common memory 504, dual port memories often require more time than the maximum speed of the common memory 504 if it were a single port memory, i.e., accessed only from one processor without the use of the multiplexers 800, 802.

Another technique to prevent collisions in accesses to common memory is to synchronize the accesses of the two processors 500-502 to be not coincidental in time with one another.

An exemplary use of dual port memory is to provide a message box area to create a new way of real-time asynchronous inter-processor communications. Conventionally, as described, asynchronous processors typically communicate using common memory (e.g., RAM, a shared register, etc.) and a multiplexed address, under the control of hand-shaking and/or interrupt driven routines. Thus, access to the common memory space is separated in time between the two ports of the dual port memory to avoid collisions in accesses to particular locations in the common memory, particularly in write cycles from either processor. Unfortunately, this type of inter-processor communication is slow because, e.g., of the serial access to the memory locations by the two processors, and because of any additional time required to handle hand-shaking and/or interrupt routines.

There is thus a need for an efficient method and apparatus to allow simultaneous, asynchronous access to common elements in a common device, e.g., in a dual port memory or other dual port, addressable device.

SUMMARY OF THE INVENTION

In accordance with the principles of the present invention, a dual port addressable device comprises a first address decoder adapted to enable access to any of a plurality of addressed locations from a first data bus. A second address decoder is adapted to enable access to any of the plurality of addressed locations from a second data bus. A wait state generator is adapted to activate a wait state signal in response to an attempted simultaneous access to any one of the plurality of addressed locations.

A method of allowing simultaneous, asynchronous access from two ports to a common addressable location in accordance with another aspect of the present invention comprises decoding a first valid address on a first port. A second valid address is simultaneously decoded on the second port while the first valid address is being decoded on the first port. A wait state signal is generated to delay a second access on the second port based on the decoded second valid address until after a first access on the first port is completed.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

This invention provides a circuit design and method for a wait state generator which provides a lockout mechanism to handle an access collision when both ports of a common device are accessed at the same time.

In accordance with the principles of the present invention, when a collision occurs, a wait signal is generated for the relevant port. In the disclosed embodiment, the wait signal is generated for the relevant port having the later attempt to access the same memory or other addressable location. The wait signal (or wait state) is generated preferably for one cycle of the clock of the relevant processor communicating with the later port.

In accordance with the principles of the present invention, the wait signals are asynchronously synchronized with the corresponding processor receiving the wait signal.

Moreover, the present invention provides a wait signal generator capable of handling the special situation when the two processors or other devices communicating with the common device (e.g., dual port memory) over respective ports are so close in time that the two active clock edges from the respectively accessing processors are well aligned.

Figure 1:
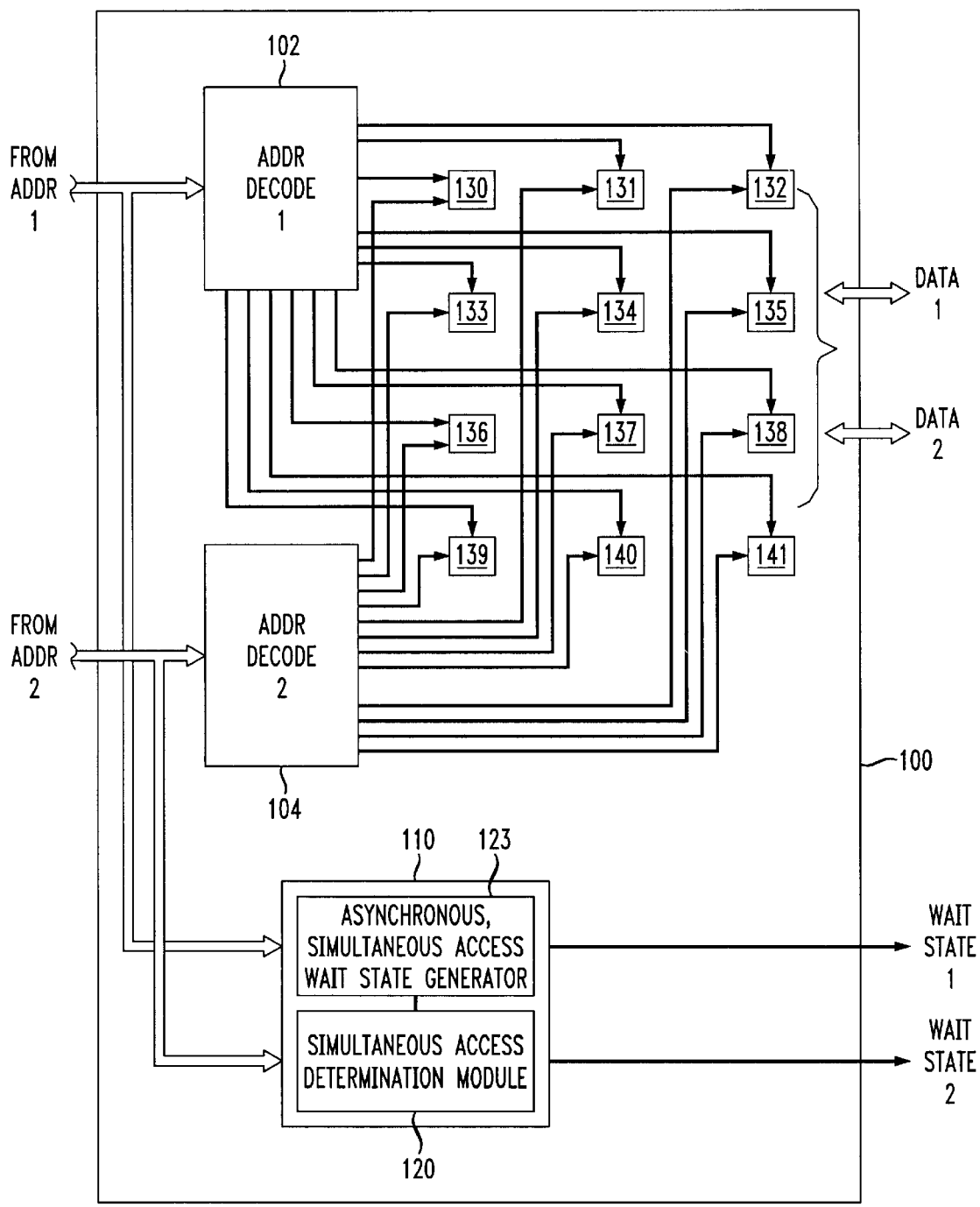
FIG. 1 shows a dual port memory implementing an asynchronous, simultaneous access wait state generator to allow simultaneous access to memory locations in the dual port memory, in accordance with the principles of the present invention.

FIG. 1 shows a dual port device, e.g., a dual port memory 100 implementing an asynchronous, simultaneous access wait state generator module 110 allowing asynchronous, simultaneous access to memory locations 130–141 in the dual port memory 100.

In particular, a first I/O port in the dual port memory 100 is formed by an address bus ADDR 1 and a data bus DATA 1, and a second I/O port is formed by another address bus ADDR 2 and another data bus DATA 2. A first processor or other addressing device communicates with the first bus ADDR 1, DATA 1, and a second processor or other addressing device communicates with the second bus ADDR 2, DATA 2.

The dual port memory 100 includes a separate address decoder 102, 104 for each of the respective ports. Upon input of a particular valid address on the address bus ADDR 1 or ADDR 2, each address decoder 102, 104 decodes which particular element in the dual port device is being accessed, e.g., which memory location 130–141. Conventional addressing, read/write and other control signals associated with the respective address and data buses are not shown for simplicity of explanation.

Upon proper decoding of a valid address, each of the address decoders 102, 104 separately enable each of the addressed memory locations 130–141, causing access to be provided via a respective one of the data buses DATA 1, DATA 2. Thus, as the first address decoder 102 is presented with a valid address on its respective address bus ADDR 1, an appropriate enable signal is provided to one of the memory elements 130–141, activating the corresponding data bus DATA 1 communicating with that particular memory element.

The first address decoder 102 enables activity on the first data bus DATA 1 only, while the second address decoder 104 enables activity on the second data bus DATA 2 only. Thus, only one memory element 130–141 will be actively utilizing either of the data buses DATA 1, DATA 2 at any one time.

Thus, the separate address decoders 102, 104 allow asynchronous access to the memory elements 130–141 based on the clock cycles of the addressing device communicating with the respective port. Moreover, the separate address decoders 102, 104 may be accessing respective memory elements 130–141 simultaneously.

The dual port memory 100 importantly includes an asynchronous, simultaneous access wait state generator module 110 to handle the particular situation when both address decoders 102, 104 happen to be accessing the same memory element at precisely the same time. In such a case, a wait signal (i.e., a wait state signal) is generated by the asynchronous, simultaneous access wait state generator module 110 to cause one of the simultaneously, asynchronously accessing processors to halt clocking of its port, or wait, until released by the asynchronous, simultaneous access wait state generator module 110 to continue its access. The wait is essentially invisible to the affected processor, but for enduring a longer memory access cycle for that particular access.

Figure 2:
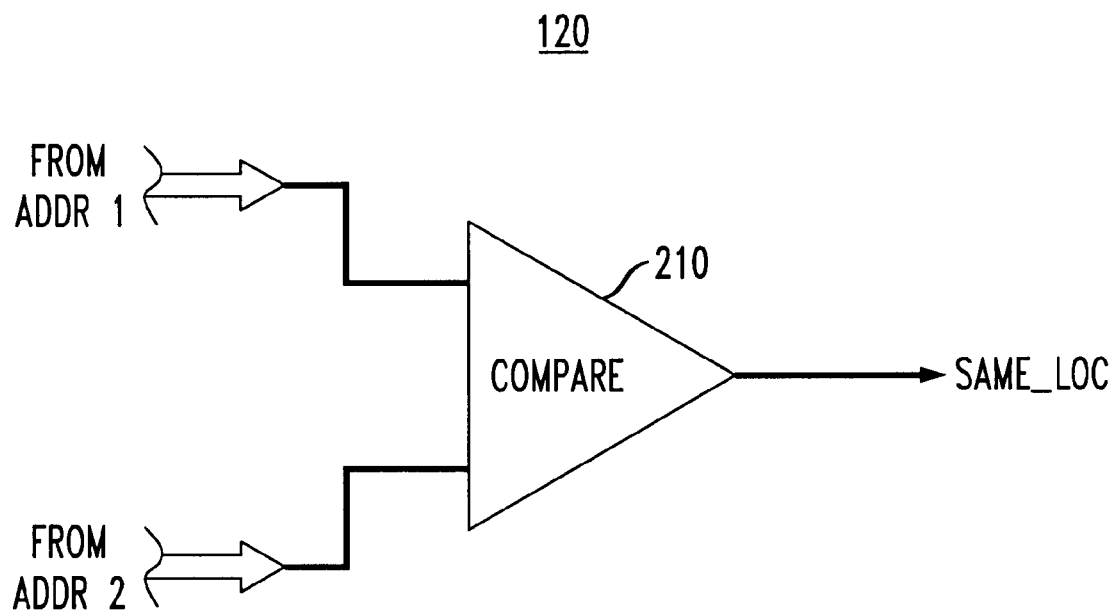
FIG. 2 a more detailed block diagram of the simultaneous access determination module shown in FIG. 1.

FIG. 2 is a more detailed block diagram of the simultaneous access determination module shown in FIG. 1.

In particular, FIG. 2 shows a block diagram depicting the comparison of two simultaneously valid and applied address signals, one on address bus ADDR 1 and the other on address bus ADDR 2, in a digital comparator 210 (e.g., a comparison algorithm in a processor). If the two simultaneous addresses indicate a collision would occur in an access to the same address location, a same location signal SAME_LOC is activated, e.g., goes to a logic HIGH state for the duration of the collision of address signals. Otherwise, the same location signal SAME_LOC remains inactive, e.g., at a logic LOW state.

The asynchronous, simultaneous access wait state generator 123 generates a wait state signal WAIT STATE 1 relating to the first port of the dual port device, and a wait state signal WAIT STATE 2 relating to access from the second port of the dual port device.

When the two simultaneously applied addresses on address buses ADDR 1, ADDR 2 are different, or when they attempt to enable the same addressed location but are both read accesses, the two operations are preferably finished without generating a wait state for either port. However, when the two simultaneous addresses are the same, and at least one of the operations is a write access, an access collision occurs. In such a case, a wait state signal is preferably generated to halt one of the processors or other addressing devices communicating with the respective ports of the dual port device.

The processors in the disclosed embodiment have clock signals which are independent (i.e., asynchronous) from one another. Thus, in accordance with the principles of the present invention, the wait state signals are generated for each port with respect to a clock signal from the accessing device relating to the respective ports. Thus, the wait state signals WAIT STATE 1, WAIT STATE 2 are preferably generated synchronous to the corresponding clock signals in the control portion of the relevant ports.

Wait state signals may be customized for the particular application. For instance, in the disclosed embodiment of a dual port memory being accessed by separate processors, both processors are presumed to change addresses on the respective address buses ADDR 1, ADDR 2 at phase (1) (e.g., when a clock signal is at a logic HIGH), and the data is transferred, e.g., during the subsequent phase(0) (e.g., when the clock signal is at a logic LOW). Thus, when a collision is determined by the simultaneous access determination module 120 (e.g., when the same location SAME_LOC signal is activated), a wait state signal should be activated to the later accessing processor at or relating to its subsequent phase(0) and should stay active for one memory cycle. This will preferably halt the later processor for one whole memory cycle without generating clocking glitches.

In determining an access collision, the first falling edge of an address valid signal or other control signal can be used to indicate which port is accessed 'later' than the other, and thus has an appropriate wait state generated for that port.

When one port has an activate wait state signal, the other port need not. Thus, a wait state signal need not be generated for both ports at the same time.

The present invention preferably accommodates the particularly unique situation when both ports have a valid address attempting to access the same memory location starting at precisely the same time such that accessing clock signals (e.g., accessing address valid signals) are aligned at their respective operating edges. Preferably, a particular port can be designated to have priority over the other(s), and thus generates a wait state for the non-priority port in that case while the priority port allows uninterrupted access to the memory location.

Figure 3:
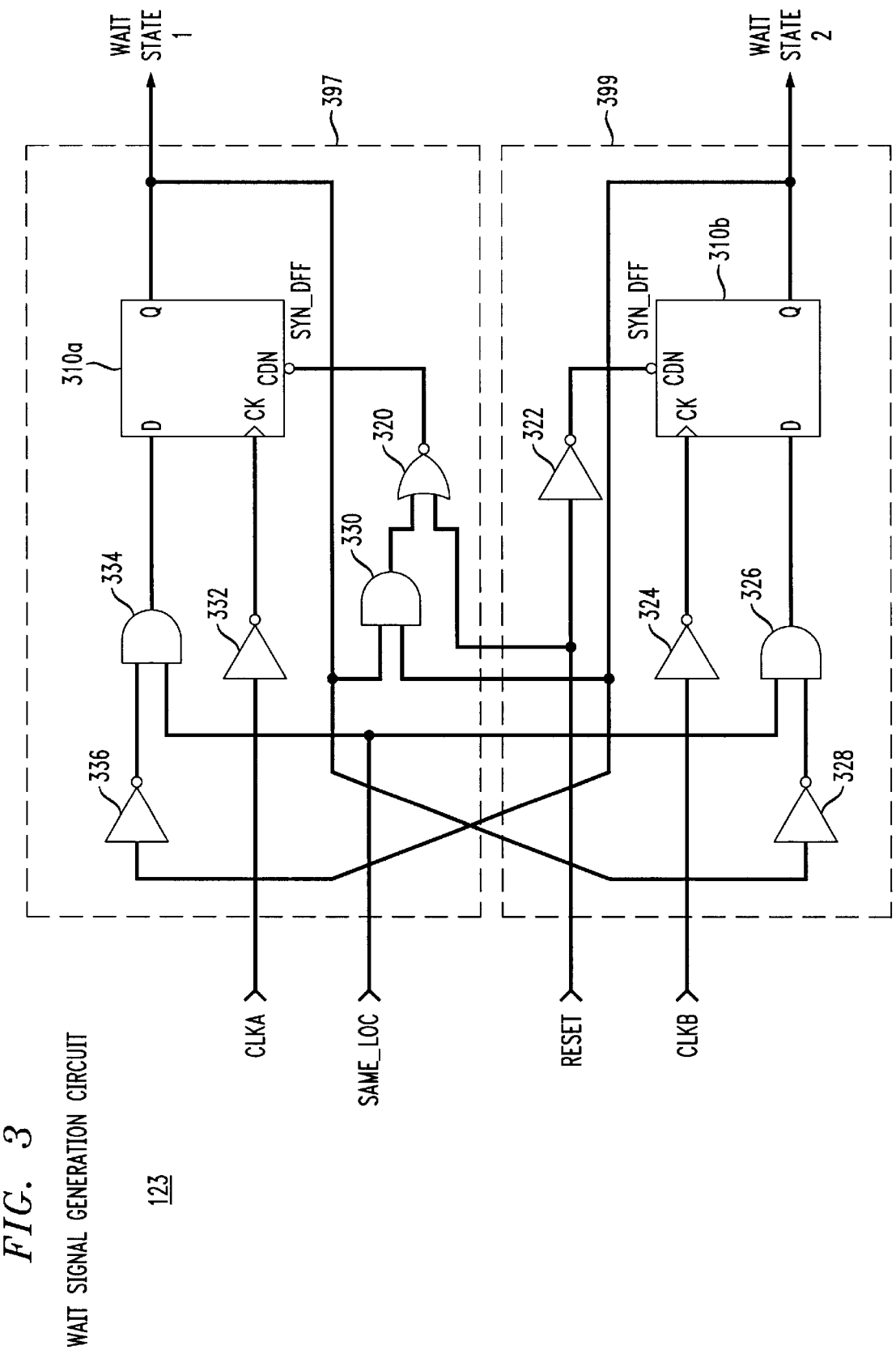
FIG. 3 a detailed schematic diagram of an exemplary wait state generation circuit of the asynchronous, simultaneous access wait state generator shown in FIG. 1.

FIG. 3 is a detailed schematic diagram of an exemplary wait state generation circuit of an asynchronous, simultaneous access wait state generator shown in FIG. 1, in accordance with the principles of the present invention.

In particular, the asynchronous, simultaneous access wait state generator 123 receives a first clock signal CLKA relating to a first port, e.g., to a first processor, and a second clock signal CLKB relating to a second port, e.g., to a second processor. The wait state generator 123 is activated by an activation of the same location SAME_LOC signal generated by the simultaneous access determination module 120 shown in FIGS. 1 and 2. Preferably, the wait state generator is reset (e.g., upon system power-up) by activation of a RESET signal.

The wait state generator 123 includes a first meta-stable wait state generator circuit 397, and a second meta-stable wait state generator circuit 399.

The first meta-stable wait state generator circuit 397 includes a meta-stable D-type Flip-Flop 310a (DFF), and the second meta-stable wait state generator circuit 399 includes another meta-stable DFF 310b.

The D input to the first meta-stable DFF 310a is provided by an ANDed combination of an inverted WAIT STATE 2 signal with the SAME_LOC signal using an inverter 336 and an AND gate 334. The clock input to the first meta-stable DFF 310a is an inverted representation of the address clock signal CLKA from the first port. The clear signal to the first meta-stable DFF 310a is provided by a NORed combination of the reset signal RESET and an ANDed combination of the WAIT STATE 1 and WAIT STATE 2 signals using a NOR gate 320 and an AND gate 330.

The second meta-stable DFF 310b is reset by an inverted reset signal RESET using an inverter 322. A clock signal is provided to the second meta-stable DFF 310b by an inverted address clock signal CLKB from the second port using an inverter 324. The D input to the second meta-stable DFF 310b is provided by an ANDed combination of the same location signal SAME_LOC and an inverted WAIT STATE 1 signal.

The inverters 322, 324, 328, 332 and 336 are standard logic gates, as are the AND gates 326, 330 and 334, and the NOR gate 320. However, the D-type Flip-Flops 310a, 310b are preferably 'synchronizers'. A synchronizer is functionally similar to a conventional D-type Flip-Flop, but additionally resolves a meta-state, i.e., when the active edge of the clock signal CK is aligned with an edge of the data D input. In such a case, a conventional D-type Flip-Flop might enter a meta-stable state for an unpredictable amount of time. However, a synchronizer is capable of quickly resolving to a final state after the operating edge of the clock signal CK occurs. Use of the synchronizers 310a, 310b prevent metastable conditions in the wait state generator module 110.

In the wait state generator 123, the WAIT STATE 1 and WAIT STATE 2 signals are cross-fed back to the AND gate 330, the output of which controls the clearing of the first meta-stable DFF 310a. Moreover, the WAIT STATE 1 and WAIT STATE 2 signals are cross-fed back and respectively inverted, and, through respective ANDing with the SAME_LOC signal, controls the data input to the first and second meta-stable DFFs 310a, 310b such that when the first meta-stable wait state generator 397 is outputting an active WAIT STATE 1 signal, the second meta-stable wait state generator 399 will not output an active WAIT STATE 2 signal, even if the same location signal SAME_LOC signal is at a logic HIGH. Similarly, if the second meta-stable wait state generator 399 is outputting an active WAIT STATE 2 signal, the first meta-stable wait state generator 397 will not output an active WAIT STATE 1 signal, even if the same location signal SAME_LOC signal is at a logic HIGH.

In the special case, when a collision occurs and the active edges (e.g., falling edges) of the asynchronous clock signals CLKA, CLKB from the respective ports are very well aligned, the synchronizers 310a, 310b would not alone be able to resolve which port should be given access to the relevant memory location. In such a case, both wait state signals WAIT STATE 1 and WAIT STATE 2 momentarily go to logic HIGH states. However, at this moment, a reset signal is generated by the AND gate 330 and NOR gate 320 to clear the first synchronizer 310a substantially instantly, so as to allow the first port access to continue while a wait state signal WAIT STATE 2 is maintained with respect to the second port.

Note that although the WAIT STATE 1 signal is momentarily active during this resolution process, this momentary 'glitch' will not affect the memory location access on the first port because the glitch will always occur in this special situation during an initial address valid phase, e.g., during phase(1).

The free running clocks CLKA, CLKB of the respective processors are input to the clock inputs of the first and second meta-stable DFFs 310a, 310b, to generate respective wait state signals which are synchronized with the particular processor.

An asynchronous, simultaneous access wait state generator module 110 in accordance with the principles of the present invention is preferably capable of proper operation not only when two ports are simultaneously accessing a same memory location but also when those two ports become valid addresses (i.e., initiate access) at precisely the same point in time. Accordingly, reliability is afforded in the dual port device such that simultaneous access can be allowed by separate, asynchronous addressing devices through separate ports to the same memory locations.

Figure 4:
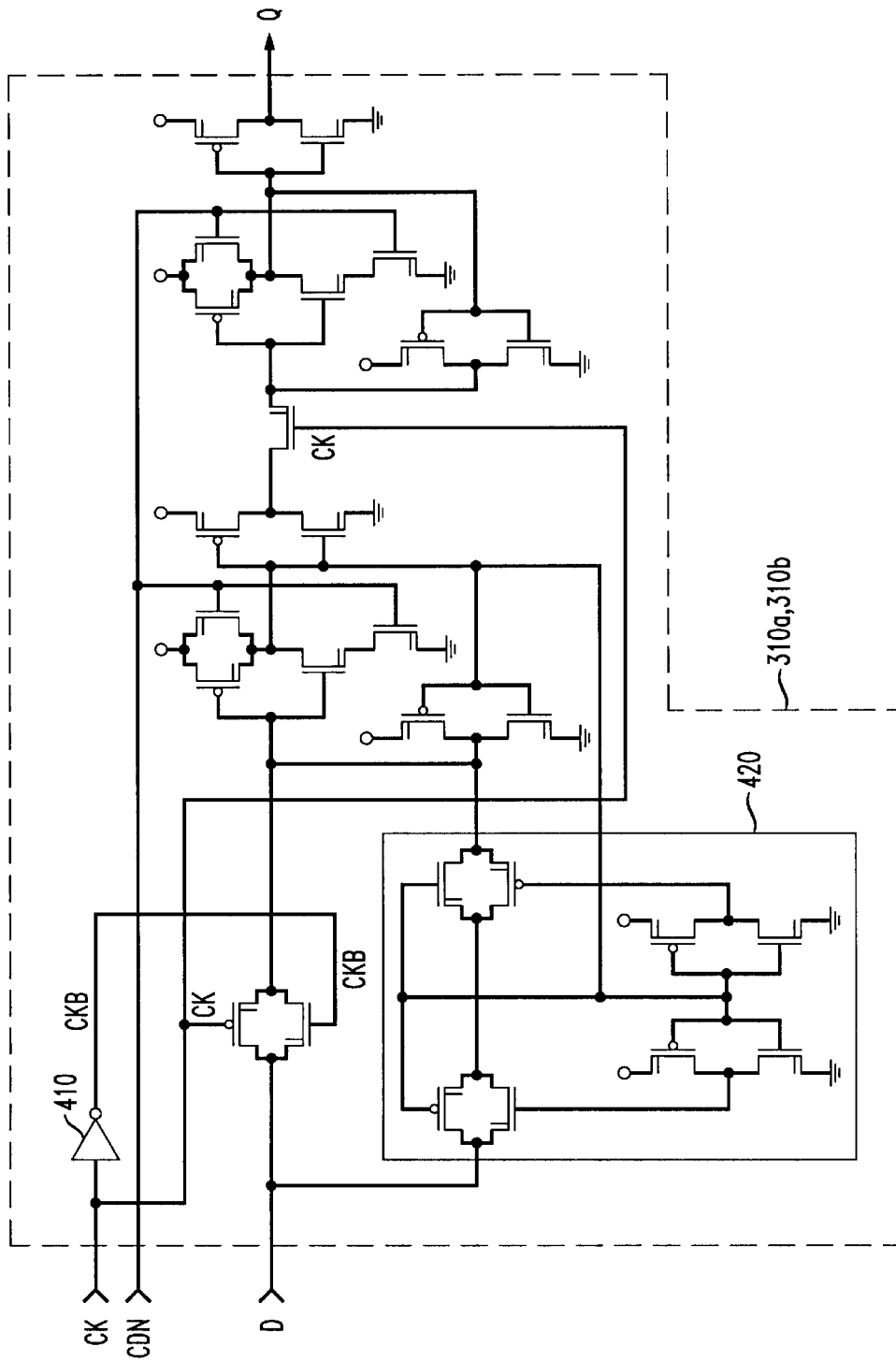
FIG. 4 shows an exemplary D-type Flip-Flop synchronizer capable of resolving meta-stable condition in the circuit shown in FIG. 3.
Figure 5:
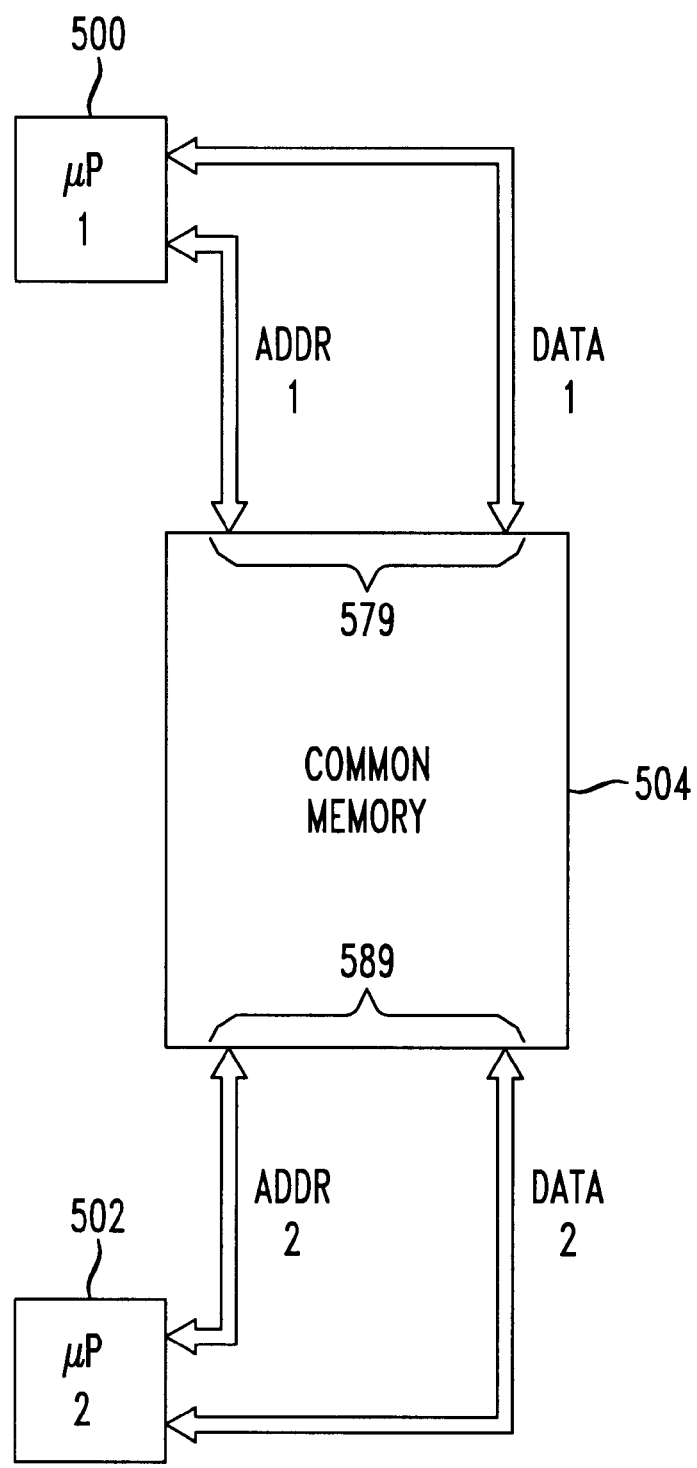
FIG. 5 shows a conventional dual port, common memory having first and second ports communicating with respective processors.
Figure 6:
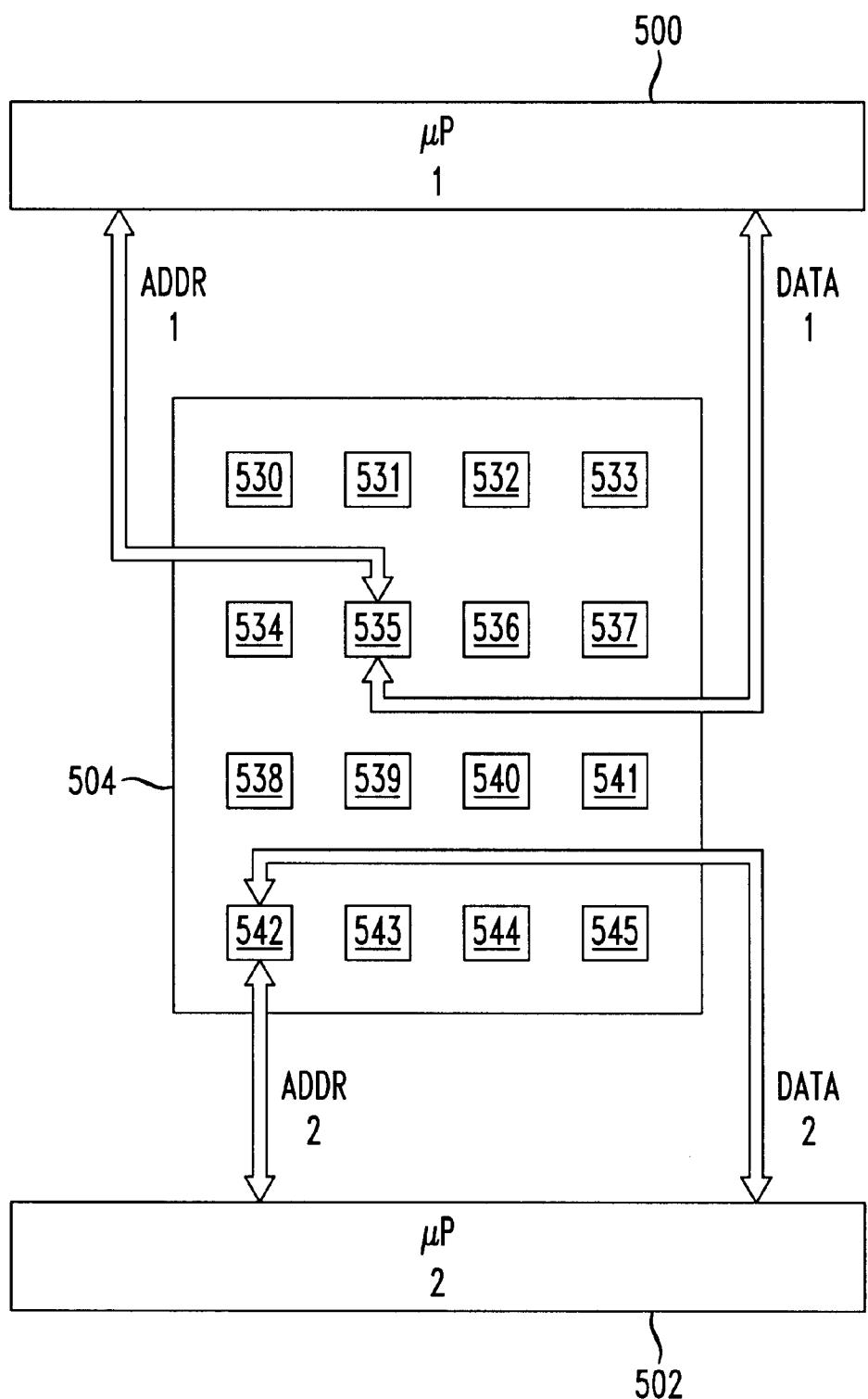
FIG. 6 depicts a conventional access to separate memory locations by two processors communicating with respective ports of a dual port, common memory.
Figure 7:
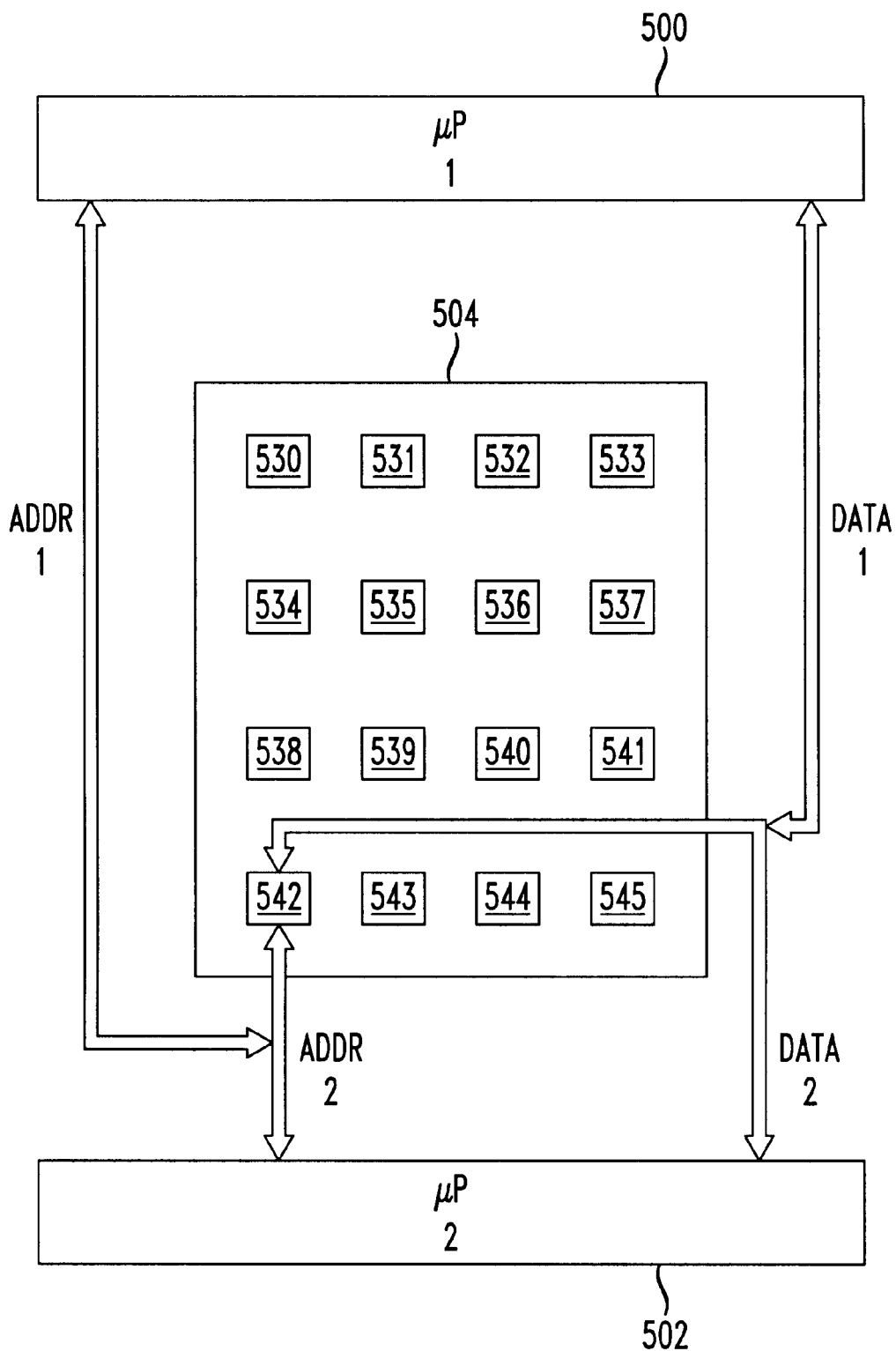
FIG. 7 shows a conventional access to the same memory location in a dual port, common memory resulting in a collision in accesses from two respective processors.
Figure 8:
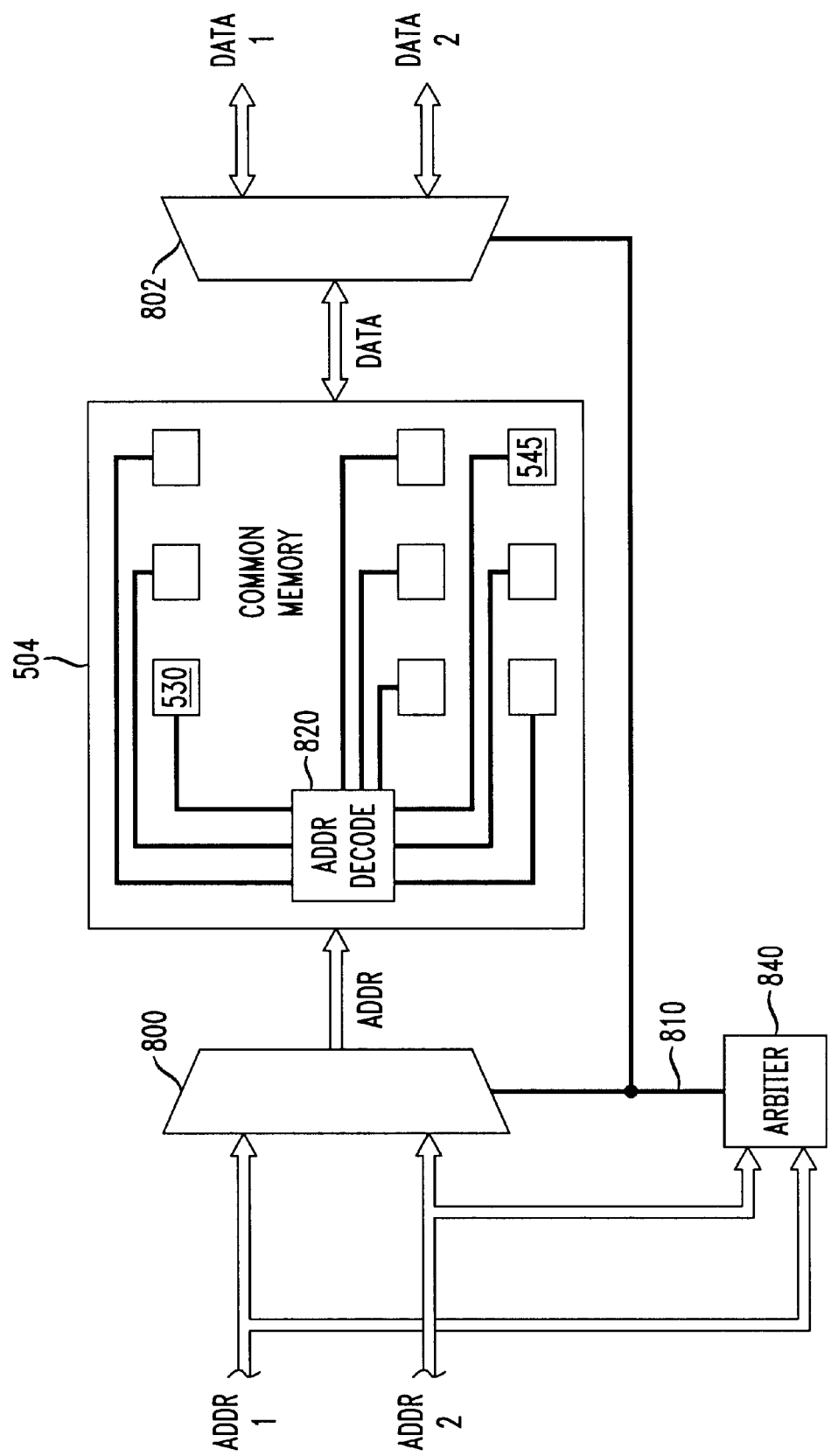
FIG. 8 shows a common solution to the problem of potential collisions in accesses to memory locations in conventional dual port memory using a multiplexed address bus technique allowing serial access to particular memory locations by two processors.

FIG. 4 shows in more detail the circuit diagram of an exemplary D-type Flip-Flop (DFF) synchronizer 310a, 310b capable of resolving a meta-stable condition as in the circuit shown in FIG. 3.

The principles of the present invention are particularly useful for providing a communication memory (or "message box") used for communication between processors in a dual processor system. The message box preferably comprises two addressable input/output (I/O) ports, and may be addressed by the processors simultaneously and asynchronously. Wait state signals are generated to provide a locking mechanism only in the event of an actual collision in the preferred embodiment.

Moreover, in accordance with the principles of the present invention, a clashing processor attempting but failing to access a particular memory location may back off in response, access another memory location in the same device while the clashing condition continues to exist, and then perhaps again attempt to access the memory location which caused the clashing or collision in the first place.

While the invention has been described with reference to the exemplary embodiments thereof, those skilled in the art will be able to make various modifications to the described embodiments of the invention without departing from the true spirit and scope of the invention.

What is claimed is:

1. A dual port addressable device, comprising:
a first address decoder adapted to enable access to a plurality of addressed locations from a first data bus;
a second address decoder adapted to enable access to said plurality of addressed locations from a second data bus; and
a wait state generator adapted to activate a wait state signal in response to an attempted simultaneous access to one of said plurality of addressed locations, said wait state generator comprising a synchronizer to resolve a meta-stable state of said wait state signal.

2. The dual port addressable device according to claim 1, wherein said wait state signal comprises at least one of:
a first wait state signal relating to attempted access from a first port; and
a second wait state signal relating to attempted access from a second port.

3. The dual port addressable device according to claim 2, wherein:
said wait state generator is adapted to maintain activation of only one of said first wait state signal and said second wait state signal for at least one memory cycle.

4. The dual port addressable device according to claim 3, wherein:
said only one of said first wait state signal and said second wait state signal is selected based on a later one of said corresponding first port and second port to access said simultaneously accessed addressed location.

5. The dual port addressable device according to claim 3, wherein:
said only one of said first wait state signal and said second wait state signal is selected based on a predetermined priority in an event that said first port and said second port initiate access to said simultaneously accessed addressed location at substantially a same point in time.

6. The dual port addressable device according to claim 1, wherein:
said first address decoder is adapted for operation asynchronous with respect to said second address decoder.

7. The dual port addressable device according to claim 1, wherein:
said dual port addressable device is a dual port memory.

8. The dual port addressable device according to claim 7, wherein:
said dual port memory is random access memory.

9. A method of allowing asynchronous access from two ports to a common addressable location, comprising:
decoding a first valid address on a first port;
simultaneously decoding a second valid address on a second port while said first valid address is being decoded on said first port; and
generating a wait state signal to delay a second access on said second port based on said decoded second valid address until after a first access on said first port is completed.

10. The method of allowing asynchronous access from two ports to a common addressable location according to claim 9, wherein:
said second valid address is initiated on said second port after said first valid address is initiated on said first port.

11. The method of allowing asynchronous access from two ports to a common addressable location according to claim 9, wherein:
said second valid address is initiated on said second port at substantially a same instant that said first valid address is initiated on said first port.

12. The method of allowing asynchronous access from two ports to a common addressable location according to claim 9, further comprising:
resolving a meta-stable condition in said wait state generator with a synchronizer.

13. The method of allowing asynchronous access from two ports to a common addressable location according to claim 9, further comprising:
synchronizing said generated wait state signal with one of a first clock signal relating to said first port and a second clock signal relating to said second port, said first clock signal being asynchronous with respect to said second clock signal.

14. Apparatus for allowing asynchronous access from two ports to a common addressable location, comprising:
means for decoding a first valid address on a first port;
means for simultaneously decoding a second valid address on said second port while said first valid address is being decoded on said first port; and
means for generating a wait state signal to delay a second access on said second port based on said decoded second valid address until after a first access on said first port is completed.

15. The apparatus for allowing asynchronous access from two ports to a common addressable location according to claim 14, wherein:

said second valid address is initiated on said second port after said first valid address is initiated on said first port.

16. The apparatus for allowing asynchronous access from two ports to a common addressable location according to claim 14, wherein:

said second valid address is initiated on said second port at substantially a same instant that said first valid address is initiated on said first port.

17. The apparatus for allowing asynchronous access from two ports to a common addressable location according to claim 14, further comprising:

means for resolving with a synchronizer, a meta-stable condition in said means for generating a wait state.

18. The apparatus for allowing asynchronous access from two ports to a common addressable location according to claim 14, further comprising:

means for synchronizing said generated wait state signal with one of a first clock signal relating to said first port and a second clock signal relating to said second port, said first clock signal being asynchronous with respect to said second clock signal.

19. A dual port addressable device, comprising:

a first address decoder adapted to enable access to a plurality of addressed locations from a first data bus;

a second address decoder adapted to enable access to said plurality of addressed locations from a second data bus; and a synchronizer to resolve a meta-stable state of a signal.

20. The dual port addressable device according to claim 19, wherein:

said signal is activated in response to an attempted simultaneous access to one of said plurality of addressed locations.

21. The dual port addressable device according to claim 19, wherein:

said signal is a wait state signal.

22. The dual port addressable device according to claim 21, wherein said wait state signal comprises at least one of:

a first wait state signal relating to attempted access from a first port; and a second wait state signal relating to attempted access from a second port.

23. The dual port addressable device according to claim 22, wherein:

a wait state generator is adapted to maintain activation of only one of said first wait state signal and said second wait state signal for at least one memory cycle.

24. The dual port addressable device according to claim 22, wherein:

said only one of said first wait state signal and said second wait state signal is selected based on a later one of said corresponding first port and second port to access said simultaneously accessed addressed location.

25. The dual port addressable device according to claim 22, wherein:

said only one of said first wait state signal and said second wait state signal is selected based on a predetermined priority in an event that said first port and said second port initiate access to said simultaneously accessed addressed location at substantially a same point in time.

26. The dual port addressable device according to claim 19, wherein:

said first address decoder is adapted for operation asynchronous with respect to said second address decoder.

27. The dual port addressable device according to claim 19, wherein:

said dual port addressable device is a dual port memory.

28. The dual port addressable device according to claim 27, wherein:

said dual port memory is random access memory.

29. A method of allowing asynchronous access from two ports to a common addressable location, comprising:

decoding a first valid address on a first port;

simultaneously decoding a second valid address on a second port while said first valid address is being decoded on said first port;

generating a wait state signal to delay a second access on said second port based on said decoded second valid address until after a first access on said first port is completed port while said first valid address is being decoded on said first port; and resolving a meta-stable condition in said wait state generator with a synchronizer.

30. The method of allowing asynchronous access from two ports to a common addressable location according to claim 29, wherein:

said second valid address is initiated on said second port after said first valid address is initiated on said first port.

31. The method of allowing asynchronous access from two ports to a common addressable location according to claim 29, wherein:

said second valid address is initiated on said second port at substantially a same instant that said first valid address is initiated on said first port.

32. The method of allowing asynchronous access from two ports to a common addressable location according to claim 29, further comprising:

synchronizing said generated wait state signal with one of a first clock signal relating to said first port and a second clock signal relating to said second port, said first clock signal being asynchronous with respect to said second clock signal.

33. A method of allowing asynchronous access from two ports to a common addressable location, comprising:

decoding a first valid address on a first port;

simultaneously decoding a second valid address on a second port while said first valid address is being decoded on said first port;

generating a wait state signal to delay a second access on said second port based on said decoded second valid address until after a first access on said first port is completed port while said first valid address is being decoded on said first port; and synchronizing said generated wait state signal with one of a first clock signal relating to said first port and a second clock signal relating to said second port, said first clock signal being asynchronous with respect to said second clock signal.

34. Apparatus for allowing asynchronous access from two ports to a common addressable location, comprising:

means for decoding a first valid address on a first port;

means for simultaneously decoding a second valid address on said second port while said first valid address is being decoded on said first port;

means for generating a wait state signal to delay a second access on said second port based on said decoded second valid address until after a first access on said first port is completed; and means for resolving with a synchronizer, a meta-stable condition in said means for generating a wait state.

35. The apparatus for allowing asynchronous access from two ports to a common addressable location according to claim 34, wherein:

said second valid address is initiated on said second port after said first valid address is initiated on said first port.

36. The apparatus for allowing asynchronous access from two ports to a common addressable location according to claim 34 wherein:

said second valid address is initiated on said second port at substantially a same instant that said first valid address is initiated on said first port.

37. The apparatus for allowing asynchronous access from two ports to a common addressable location according to claim 34, further comprising:

means for synchronizing said generated wait state signal with one of a first clock signal relating to said first port and a second clock signal relating to said second port, said first clock signal being asynchronous with respect to said second clock signal.

38. Apparatus for allowing asynchronous access from two ports to a common addressable location, comprising:

means for decoding a first valid address on a first port;

means for simultaneously decoding a second valid address on said second port while said first valid address is being decoded on said first port;

means for generating a wait state signal to delay a second access on said second port based on said decoded second valid address until after a first access on said first port is completed; and means for synchronizing said generated wait state signal with one of a first clock signal relating to said first port and a second clock signal relating to said second port, said first clock signal being asynchronous with respect to said second clock signal.

* * * * *